United States Patent
Dang et al.

(10) Patent No.: US 12,122,014 B2
(45) Date of Patent: Oct. 22, 2024

(54) REPLACING TOOL FOR SPONGE BRUSH, METHOD FOR INSTALLING SPONGE BRUSH, AND SEMICONDUCTOR CHEMICAL MECHANICAL POLISHING APPARATUS

(71) Applicant: CHANGXIN MEMORY TECHNOLOGIES, INC., Anhui (CN)

(72) Inventors: Jinwei Dang, Hefei (CN); Chin-Chung Ku, Hefei (CN); Lingfeng Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 524 days.

(21) Appl. No.: 17/443,538

(22) Filed: Jul. 27, 2021

(65) Prior Publication Data

US 2022/0023992 A1     Jan. 27, 2022

Related U.S. Application Data

(63) Continuation of application No. PCT/CN2021/093136, filed on May 11, 2021.

(30) Foreign Application Priority Data

Jul. 23, 2020    (CN) .................. 202010714828.9

(51) Int. Cl.
    *B24B 37/34*      (2012.01)
    *B24B 37/04*      (2012.01)

(52) U.S. Cl.
    CPC ............ *B24B 37/34* (2013.01); *B24B 37/042* (2013.01)

(58) Field of Classification Search
    CPC ......... Y10T 29/53917; Y10T 29/53952; Y10T 29/53987; H01L 21/67046;
(Continued)

(56) References Cited

U.S. PATENT DOCUMENTS

| | | | | |
|---|---|---|---|---|
| 747,101 A | * | 12/1903 | Williams | ................ G06F 1/187 |
| | | | | 73/66 |
| 1,793,615 A | * | 2/1931 | Hooker | ..................... B66C 1/14 |
| | | | | 294/82.1 |

(Continued)

FOREIGN PATENT DOCUMENTS

| | | |
|---|---|---|
| CN | 1355929 A | 6/2002 |
| CN | 104853999 A | 8/2015 |

(Continued)

*Primary Examiner* — Brian D Keller
*Assistant Examiner* — Alberto Saenz
(74) *Attorney, Agent, or Firm* — Syncoda LLC; Feng Ma

(57) ABSTRACT

The replacing tool includes a first beam, a connection mechanism, a second beam, a first hook, and a second hook. The first beam is connected to the second beam through the connection mechanism. The first hook is fixedly connected to the first beam, and a portion of the first hook is configured to be engaged into a concave end of the sponge brush. The second hook is fixedly connected to the second beam, and a portion of the second hook is arranged around a convex end of the sponge brush. The first beam and the second beam are movable relative to each other, so that the first hook is engaged with or detached from the concave end of the sponge brush and the second hook is engaged with or detached from the convex end of the sponge brush.

10 Claims, 12 Drawing Sheets

(58) Field of Classification Search
CPC ......... H01L 21/67028; H01L 21/02057; B08B 13/00; A46B 13/001; A46B 13/02; B25G 1/066; B25G 3/38; B25B 13/08; B25B 5/103; B24B 37/34; B24B 37/042; B24B 45/00; B24B 45/003; B66C 1/14; B66C 1/28; B66C 1/30
USPC ...... 451/41, 178, 190, 200, 207, 241; 15/77, 15/88.3, 88.4; 81/125.1, 177.7; 294/17, 294/26, 28, 81.56, 82.13, 85, 101, 169, 294/171
See application file for complete search history.

(56) References Cited

U.S. PATENT DOCUMENTS

| | | | | |
|---|---|---|---|---|
| 2,553,133 | A * | 5/1951 | Conner | B65G 17/20 411/956 |
| 6,039,374 | A * | 3/2000 | Klein | B66C 1/66 294/81.61 |
| 6,079,761 | A * | 6/2000 | Sadeck | F42B 12/68 114/302 |
| 6,595,566 | B1 * | 7/2003 | Donnan | B66F 19/005 294/16 |
| 2002/0062842 | A1 | 5/2002 | Mikhaylich | |
| 2004/0135389 | A1 * | 7/2004 | Helms | B66C 1/442 294/110.1 |
| 2004/0216764 | A1 | 11/2004 | Mikhaylich | |
| 2015/0251834 | A1 | 9/2015 | Doering et al. | |
| 2020/0391258 | A1 * | 12/2020 | Fujimoto | H01L 21/67028 |

FOREIGN PATENT DOCUMENTS

| | | |
|---|---|---|
| CN | 204727433 U | 10/2015 |
| CN | 106533028 A | 3/2017 |
| CN | 206243892 U | 6/2017 |
| CN | 209275421 U | 8/2019 |
| JP | H11255261 A | 9/1999 |

* cited by examiner

REPLACING TOOL FOR SPONGE BRUSH, METHOD FOR INSTALLING SPONGE BRUSH, AND SEMICONDUCTOR CHEMICAL MECHANICAL POLISHING APPARATUS

CROSS-REFERENCE TO RELATED APPLICATIONS

This application is a continuation of International Patent Application No. PCT/CN2021/093136 filed on May 11, 2021, which claims priority to Chinese Patent Application No. 202010714828.9 filed on Jul. 23, 2020. The disclosures of these applications are hereby incorporated by reference in their entirety.

BACKGROUND

At the present stage, in a Chemical Mechanical Polishing (simply referred to as CMP) process, after a wafer is polished, it is necessary to clean the wafer with a sponge brush and chemical substance. At present, the sponge brush is mostly replaced by an operator manually, so that the sponge brush is easily contaminated, which in turn affects the cleaning capability of the sponge brush.

It should be noted that the above information disclosed in the Background section is only for enhancement of understanding of the background of the disclosure, and therefore it may contain information that does not constitute the related art that is already known to a person of ordinary skill in the art.

SUMMARY

An object of the disclosure is to overcome the defects in the related art, and to provide a replacing tool for a sponge brush of a semiconductor chemical mechanical polishing apparatus, a method for installing a sponge brush of a semiconductor chemical mechanical polishing apparatus, and a semiconductor chemical mechanical polishing apparatus.

According to a first aspect of the disclosure, there is provided a replacing tool for a sponge brush of a semiconductor chemical mechanical polishing apparatus. The replacing tool includes a first beam, a connection mechanism, a second beam, a first hook, and a second hook. The first beam is connected to the second beam through the connection mechanism. The first hook is fixedly connected to the first beam, and a portion of the first hook is configured to be engaged into a concave end of the sponge brush. The second hook is fixedly connected to the second beam, and a portion of the second hook is arranged around a convex end of the sponge brush.

The first beam and the second beam are movable relative to each other, so that the first hook is engaged with or detached from the concave end of the sponge brush, and the second hook is engaged with or detached from the convex end of the sponge brush.

In one exemplary embodiment of the disclosure, the connection mechanism is a hinge mechanism.

The hinge mechanism includes a first connection sheet, a rotating shaft, and a second connection sheet. The first connection sheet is rotatably connected to the second connection sheet through the rotating shaft. The first connection sheet is connected to the first beam, and the second connection sheet is connected to the second beam.

In an exemplary embodiment of the disclosure, the connection mechanism is a sliding mechanism including a sliding structure and a return spring. The sliding structure is arranged on the second beam, and the first beam is provided with a sliding hole which is slidably matched with the sliding structure. One end of the return spring is connected to the first beam, and another end of the return spring is connected to the second beam. The first hook is movable in a direction toward or away from the second hook when the sliding structure and the sliding hole slide relative to each other.

In one exemplary embodiment of the disclosure, the sliding structure includes a linkage arranged on the second beam and at least one sliding assembly arranged on the linkage.

The sliding assembly includes a sliding shaft, a first limiting sheet, and a second limiting sheet. One end of the sliding shaft is arranged on the linkage, and another end of the sliding shaft passes through the sliding hole. The first limiting sheet is limited on a side of the first beam close to the second beam, and is arranged around the sliding shaft. The second limiting sheet is limited on another side of the first beam away from the second beam and is connected to the sliding shaft.

In one exemplary embodiment of the disclosure, the first hook includes a first planar part and a second planar part disposed at an angle relative to each other, and an arc part for connecting the first planar part and the second planar part with each other.

An outer surface of each of the first planar part, the second planar part and the arc part is in contact with an inner wall surface of the concave end of the sponge brush.

In one exemplary embodiment of the disclosure, the second hook includes a third planar part and a fourth planar part parallel to each other, and a fifth planar part for connecting the third planar part and the fourth planar part with each other. The fifth plane part is connected with the third planar part and the fourth planar part by an arc transition.

An inner surface of each of the third planar part, the fourth planar part and the fifth planar part is in contact with an outer wall surface of the convex end of the sponge brush.

In one exemplary embodiment of the disclosure, the replacing tool is an anti-corrosion structure.

According to a second aspect of the disclosure, there is provided a method for installing a sponge brush of a semiconductor chemical mechanical polishing apparatus. The method includes the following operations.

A first hook of the replacing tool described above is engaged into a concave end of the sponge brush, and a second hook of the replacing tool is arranged around a convex end of the sponge brush, so as to clamp the sponge brush.

The replacing tool is moved to place the concave end of the sponge brush on a driven shaft of the semiconductor chemical mechanical polishing apparatus.

The first hook of the replacing tool is detached from the concave end.

A driving force is applied to the first hook from the second hook of the replacing tool, so that the concave end of the sponge brush is engaged with the driven shaft, and the convex end of the sponge brush is assembled on a driving shaft of the semiconductor chemical mechanical polishing apparatus.

The second hook of the replacing tool is detached from the convex end.

In one exemplary embodiment of the disclosure, the operation that the first hook of the replacing tool is detached from the concave end includes the following operation that: a first beam is rotated in a direction away from the sponge brush, so as to tilt the first hook and to detach the first hook from the convex end of the sponge brush.

Alternatively, the operation that the first hook of the replacing tool is detached from the concave end includes the following operation that: the first beam slides in a direction toward the driven shaft, so as to slide the first hook in a direction away from the second hook and to detach the first hook from the convex end of the sponge brush.

According to a third aspect of the disclosure, there is provided a semiconductor chemical mechanical polishing apparatus, including: a driving shaft, a driven shaft, a sponge brush, and the replacing tool described above. The sponge brush is provided with a concave end and a convex end. The concave end of the sponge brush is engaged with the driven shaft and the convex end of the sponge brush is engaged with the driving shaft through the replacing tool.

It should be understood that both the foregoing general description and the detailed description below are merely exemplary and explanatory, and do not limit the disclosure.

BRIEF DESCRIPTION OF THE DRAWINGS

The accompanying drawings herein are incorporated in and constitute a part of this specification, illustrate embodiments consistent to the disclosure, and, together with the description, serve to explain the principles of the disclosure. Apparently, the accompanying drawings in the following description show merely some embodiments of the disclosure, and persons of ordinary skill in the art may still derive other drawings from these accompanying drawings without creative effort, in which.

Figure 1:
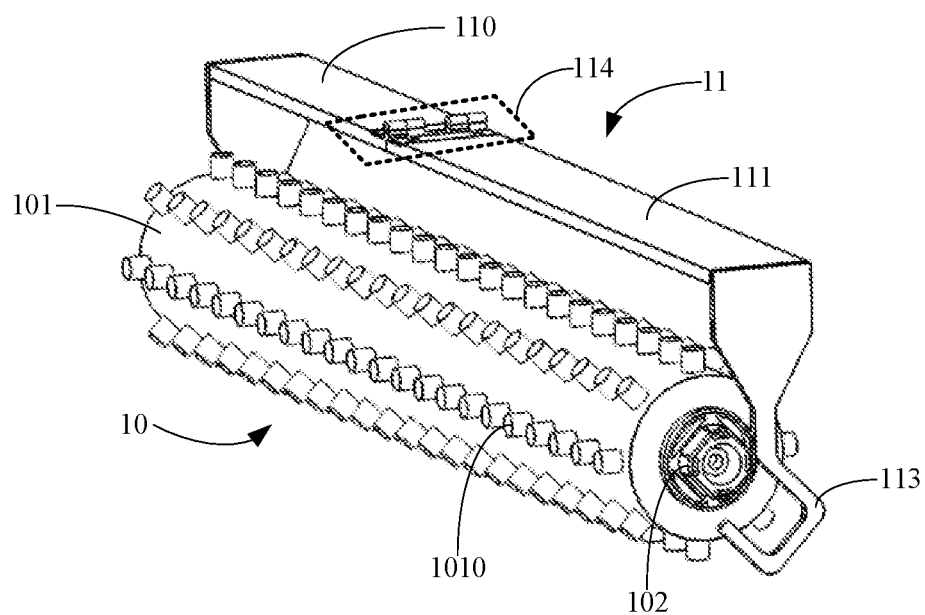
FIG. 1 shows an assembling schematic diagram of a replacing tool and a sponge brush according to one embodiment of the disclosure.

REFERENCE NUMERALS 10, sponge brush; 101, roller brush part; 1010, sponge brush head; 102, convex end; 103, concave end;
11, replacing tool; 110, first beam; 1101, sliding hole; 111, second beam; 112, first hook; 1120, first planar part; 1121, second planar part; 1122, arc part; 113, second hook; 1130, third planar part; 1131, fourth planar part; 1132, fifth planar part; 1133, installing notch; 114, hinge mechanism; 1141, first connection sheet; 1142, second connection sheet; 1143, rotating shaft; 115, sliding mechanism; 1150, return spring; 1151, linkage; 1152, sliding shaft; 1153, first limiting sheet; 1154, second limiting sheet;
12, spraying mechanism; 13, driving wheel; 14 idler wheel; and 15 wafer.

DETAILED DESCRIPTION

The exemplary embodiments will now be described more comprehensively with reference to the accompanying drawings. However, the exemplary embodiments can be implemented in various forms and should not be construed as being limited to the embodiments set forth herein. Rather, these embodiments are provided so that the disclosure will be thorough and complete, and the concepts of the exemplary embodiments will be conveyed fully to those skilled in the art. Same reference numerals in the drawings indicate the same or similar structures, and therefore their detailed description will be omitted.

Although relative terms such as "above" and "below" are used in the specification to describe a relative relationship of one component to another component shown, these terms are only for convenience in this specification, for example, according to an exemplary direction illustrated in the drawings. It will be appreciated that if the device shown is flipped upside down, the component described "above" will become the component "below". When a structure is "on" another structure, it may mean that a structure is integrally formed on another structure, or that a structure is "directly" disposed on another structure, or that a structure is "indirectly" disposed on another structure through the other structures.

The terms "a", "an", "the", and "said" are used to indicate that there are one or more elements/components/etc. The terms "include" and "have" are used to indicate an open meaning of including and means that there may be additional elements/components/etc. in addition to the listed elements/components/etc. The terms "first" and "second", etc. are used only as labels and are not intended to limit the number of objects.

As shown in FIG. 1, FIG. 2, FIG. 3 and FIG. 7, an embodiment of the disclosure provides a replacing tool 11. The replacing tool 11 may replace a sponge brush 10 of a semiconductor chemical mechanical polishing apparatus.

The sponge brush 10 may include a roller brush part 101 and a convex end 102 and a concave end 103 arranged at either end of the roller brush part 101. The roller brush part 101 may include a roller brush shaft and a sponge structure surrounding an outer peripheral surface of the roller brush shaft. An outer surface of the sponge structure may have sponge brush heads 1010 which are arranged uniformly at intervals, so as to clean a surface of a wafer better. The convex end 102 may be arranged at one end of the roller brush shaft and protruded relative to an end surface of the sponge structure. The concave end 103 may be arranged at the other end of the roller brush shaft and is recessed relative to the other end surface of the sponge structure. The convex end 102 may be engaged with a driving shaft in the semiconductor chemical mechanical polishing apparatus, and the concave end 103 may be engaged with a driven shaft in the semiconductor chemical mechanical polishing apparatus, so that the whole sponge brush 10 is installed in the semiconductor chemical mechanical polishing apparatus.

It should be noted that the roller brush shaft, the convex end 102 and the concave end 103 may be made of metal material or alloy material, so that the structural strength of the whole sponge brush 10 may be ensured, thereby facilitating the engagement of the sponge brush 10 with other structures (for example: the driven shaft, the driving shaft, the replacing tool 11, etc.). However, it is not limited herein. They may also be made of other materials, as long as certain strength of the whole sponge brush 10 can be ensured. In addition, the convex end 102, the concave end 103, and the roller brush shaft are detachably connected or undetachably connected with each other, depending on a specific circumstance.

The replacing tool 11 may include a first beam 110, connection mechanisms 114 and 115, a second beam 111, a first hook 112, and a second hook 113. The first beam 110 may be connected to the second beam 111 through the connection mechanisms 114 and 115. The first hook 112 may be fixedly connected to the first beam 110, and a portion of the first hook 112 can be engaged into the concave end 103 of the sponge brush 10. The second hook 113 is fixedly connected to the second beam 111, and a portion of the second hook 113 is arranged around the convex end 102 of the sponge brush 10. The first beam 110 and the second beam 111 are movable relative to each other, so that the first hook 112 and the second hook 113 can be detached from the concave end 103 and the convex end 102 of the sponge brush 10 respectively. Specifically, when the sponge brush 10 in the semiconductor chemical mechanical polishing apparatus needs to be replaced, a portion of the second hook 113 may be arranged around the convex end 102 of the sponge brush 10, and then the first beam 110 moves relative to the second beam 111, so that the first hook 112 is engaged into the concave end 103 of the sponge brush 10, and the replacing tool 11 clamps the sponge brush 10, thereby replacing the sponge brush 10. When the replacement of the sponge brush 10 is completed, the first beam 110 is movable relative to the second beam 111, so that the first hook 112 is detached from the concave end 103 of the sponge brush 10, and the second hook 113 is detached from the convex end 102 of the sponge brush 10.

Figure 4:
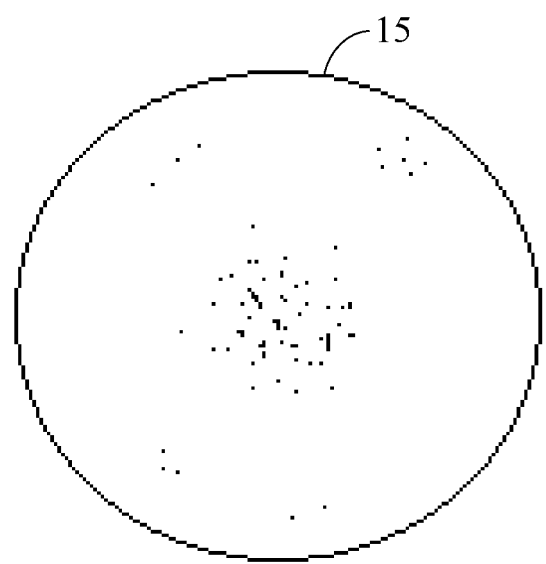
FIG. 4 is a schematic diagram of a surface of a wafer cleaned by a sponge brush after an operator replaces the sponge brush manually in the related art.
Figure 5:
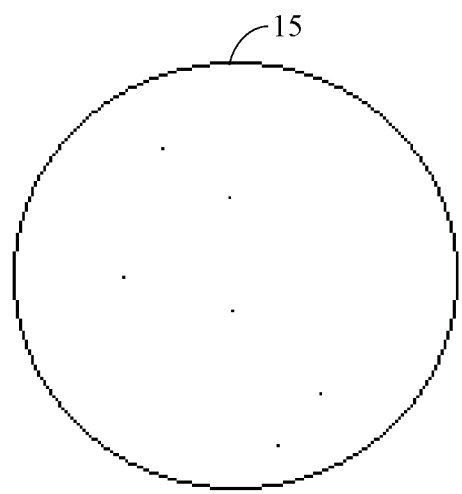
FIG. 5 is a schematic diagram of a surface of a wafer cleaned by a sponge brush after the sponge brush is replaced by using a replacing tool according to one embodiment of the disclosure.

In the embodiment of the disclosure, the sponge brush 10 of the semiconductor chemical mechanical polishing apparatus is replaced by using the replacing tool 11 provided by the disclosure, so that it may avoid the situation that the sponge brush 10 is contaminated due to direct or indirect touch of the operator when the sponge brush 10 is replaced, as shown specifically in FIG. 4 and FIG. 5. FIG. 4 is a schematic diagram of a surface of a wafer 15 cleaned by a sponge brush 10 after an operator replaces the sponge brush 10 manually in the related art. FIG. 5 is a schematic diagram of a surface of a wafer 15 cleaned by a sponge brush 10 after the sponge brush 10 is replaced by using a replacing tool 11 according to the disclosure. Comparing the particle residues (black dots on the wafer 15 in figures) on the surface of the wafer 15 shown in FIG. 4 and FIG. 5, it can be seen that there are more particle residues on the surface of the wafer 15 in FIG. 4 and fewer particle residues on the surface of the wafer 15 in FIG. 5.

Therefore, compared with the solution of replacing the sponge brush 10 manually by the operator, the solution of replacing the sponge brush 10 by using the replacing tool 11 may greatly reduce the possibility of the contamination of the sponge brush 10 during a replacement process, so that it is possible to avoid the situation that excessive particles remain on the surface of the wafer due to the contamination of the sponge brush 10, thereby improving the quality of the product, reducing the abnormal consumption of wafer consumables, and saving the labor costs.

In addition, the replacing tool 11 is easy to operate. The operator may replace the sponge brush 10 by using the replacing tool 11 through simple training.

It should be noted that a fixed connection mentioned in the disclosure means that the two components will not move relative to each other after they are connected with each other, but does not mean that the two components connected with each other cannot be detached. The two components fixedly connected with each other in the disclosure may be integrally formed and cannot be detached; or the two components may also be detached, depending on a specific circumstance.

Figure 6:
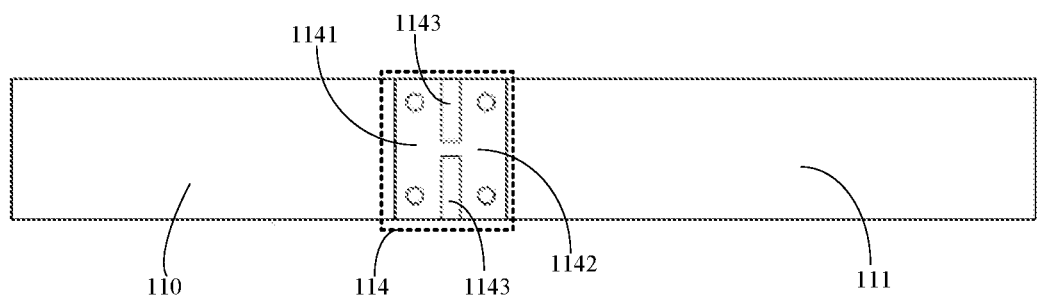
FIG. 6 shows a schematic plan diagram of a replacing tool from a viewing angle according to one embodiment of the disclosure.

For example, since a position of the second beam 111 is generally determined firstly, and then a position of the first beam 110 is adjusted during a process of clamping the sponge brush 10 by the replacing tool 11, in order to facilitate the rapid adjustment of the second beam 111, as shown in FIG. 6, a length of the first beam 110 may be smaller than that of the second beam 111. However, it is not limited herein. The length of the first beam may also be greater than or equal to that of the second beam 111, depending on a specific circumstance.

In one embodiment of the disclosure, as shown in FIG. 1 and FIG. 6, the foregoing connection mechanism may be a hinge mechanism 114. The hinge mechanism 114 may include a first connection sheet 1141, a rotating shaft 1143 and a second connection sheet 1142. The first connection sheet 1141 may be rotatably connected to the second connection sheet 1142 through the rotating shaft 1143. The first connection sheet 1141 may be connected to the first beam 110, and the second connection sheet 1142 may be connected to the second beam 111. Specifically, when the sponge brush 10 in the semiconductor chemical mechanical polishing apparatus needs to be replaced, a portion of the second hook 113 may be arranged around the convex end 102 of the sponge brush 10 firstly. In this case, the position of the second beam 111 is determined. Then the first beam 110 is rotated in a direction toward the sponge brush 10, so that the first hook 112 is engaged into the concave end 103 of the sponge brush 10, and the replacing tool 11 clamps the sponge brush 10, thereby replacing the sponge brush 10. When the replacement of the sponge brush 10 is completed, the first beam 110 may be rotated in a direction away from the sponge brush 10, so that the first hook 112 is detached from the concave end 103 of the sponge brush 10. Then the second hook 113 is detached from the convex end 102 of the sponge brush 10.

It should be noted that the hinge mechanism 114 may be made of metal material or alloy material, so as to ensure that the hinge mechanism 114 has sufficient strength and structural stability. However, it is not limited herein, and the hinge mechanism may also be made of other materials, depending on a specific circumstance. In addition, the first connection sheet 1141 may be connected to the first beam 110 through a bolt, and the second connection sheet 1142 may be connected to the second beam 111 through a bolt. However, it is not limited herein, and other connection methods may also be adopted.

Figure 7:
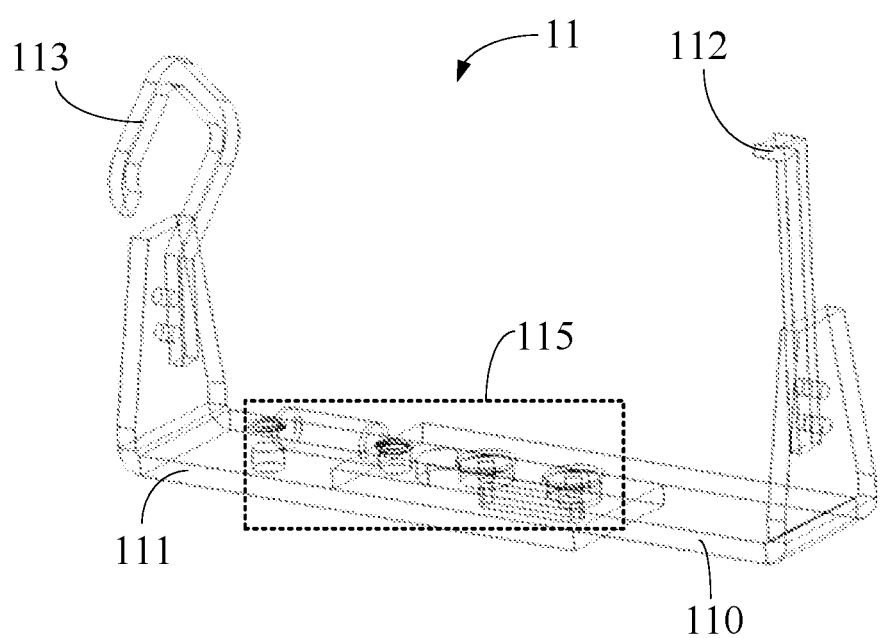
FIG. 7 shows a perspective schematic diagram of a replacing tool according to another embodiment of the disclosure.
Figure 8:
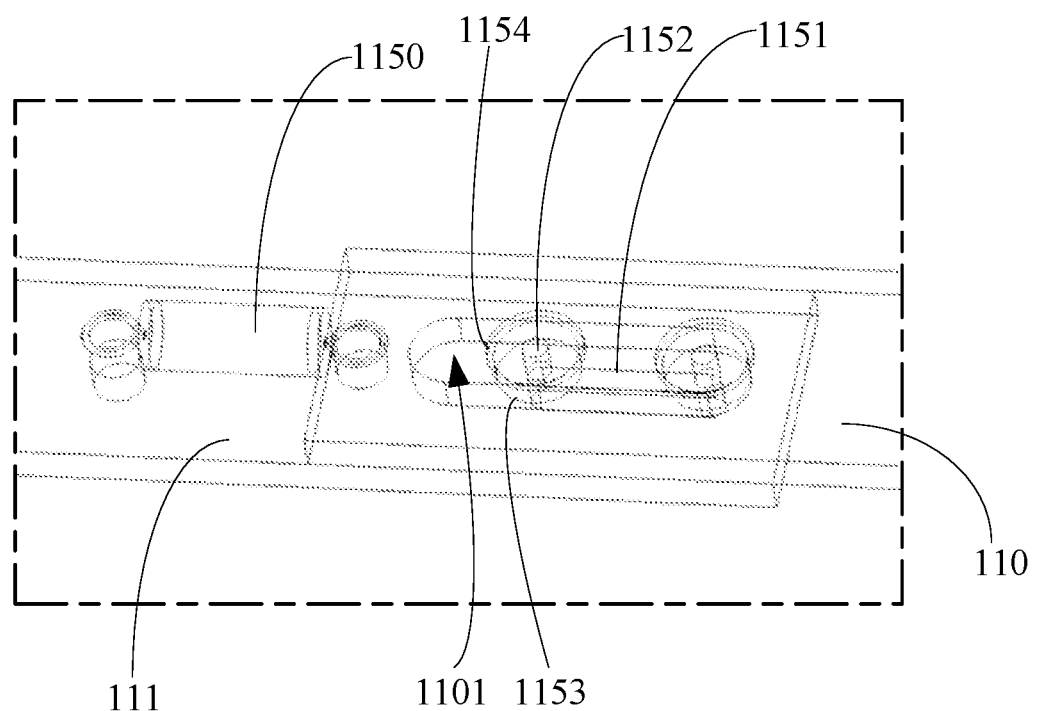
FIG. 8 shows a perspective schematic diagram of a structure after a first beam, a second beam, and a sliding mechanism in a replacing tool are assembled according to another embodiment of the disclosure.

In another embodiment of the disclosure, as shown in FIG. 7 and FIG. 8, the connection mechanism is a sliding mechanism 115. The sliding mechanism 115 may include a sliding structure and a return spring 1150. The sliding structure may be arranged on the second beam 111, and the first beam 110 is provided with a sliding hole 1101 slidably matched with the sliding structure. Two ends of the return spring 1150 are respectively connected to the first beam 110 and the second beam 111. The first hook 112 may move in a direction toward or away from the second hook 113 when the sliding structure slides relative to the sliding hole 1101. Specifically, when the sponge brush 10 in the semiconductor chemical mechanical polishing apparatus needs to be replaced, a portion of the second hook 113 may be arranged around the convex end 102 of the sponge brush 10 firstly. In this case, the position of the second beam 111 is determined. Then the first beam 110 is pulled in the direction away from the second beam 111, so that the first hook 112 may be engaged into the concave end 103 of the sponge brush 10, and the replacing tool 11 clamps the sponge brush 10, thereby replacing the sponge brush 10. When the replacement of the sponge brush 10 is completed, the first beam 110 is pulled in a direction away from the second beam, so that the first hook 112 is detached from the concave end 103 of the sponge brush 10. Then the second hook 113 is detached from the convex end 102 of the sponge brush 10. It should be noted that after the replacing tool 11 is detached from the sponge brush 10, the first beam 110 may slide in the direction toward the first beam 110 when the return spring 1150 restores its elastic deformation, i.e., return is completed.

In one embodiment, as shown in FIG. 8, the sliding structure may include a linkage 1151 arranged on the second beam 111, and at least one sliding assembly arranged on the linkage 1151. The sliding assembly may include a sliding shaft 1152, a first limiting sheet 1153 and a second limiting sheet 1154. One end of the sliding shaft 1152 may be arranged on the linkage 1151, and another end of the sliding shaft passes through the sliding hole 1101. The first limiting sheet 1153 is limited on a side of the first beam 110 close to the second beam 111 and is arranged around the sliding shaft 1152. The second limiting sheet 1154 is limited on another side of the first beam 110 away from the second beam 111 and is connected to the sliding shaft 1152. The second limiting sheet 1154 may be detachably or undetachably connected to the sliding shaft 1152, depending on a specific circumstance.

For example, the sliding hole 1101 may be of an elongated circular shape, as shown in FIG. 8. A lengthwise direction of the sliding hole 1101 may be a lengthwise direction of each of the first beam 110 and the second beam 111. The first limiting sheet 1153 and the second limiting sheet 1154 may be of a circular shape, as shown in FIG. 8. A radial size of each of the first limiting sheet 1153 and the second limiting sheet 1154 is greater than a width of the sliding hole 1101, so as to ensure that the first limiting sheet 1153 and the second limiting sheet 1154 are respectively limited on either side of the first beam 110, thereby ensuring the connection stability of the first beam 110 and the second beam 111.

It should be noted that the shape of each of the sliding hole 1101, the first limiting sheet 1153 and the second limiting sheet 1154 are not limited to the shape mentioned above, but may also be other shapes, as long as the relative sliding between the first beam 110 and the second beam 111 is ensured and the sliding is stable.

As shown in FIG. 8, two or more sliding assemblies may be provided, so that the sliding stability may be ensured while ensuring that the first beam 110 and the second beam 111 can slide relative to each other.

It should be noted that the connection mechanism in the embodiment of the disclosure is not limited to the above-mentioned hinge mechanism 114 and sliding mechanism 115, but may be other mechanisms, as long as it is ensured that the replacing tool 11 can clamp the sponge brush 10 and be detached from the sponge brush 10 conveniently.

Figure 2:
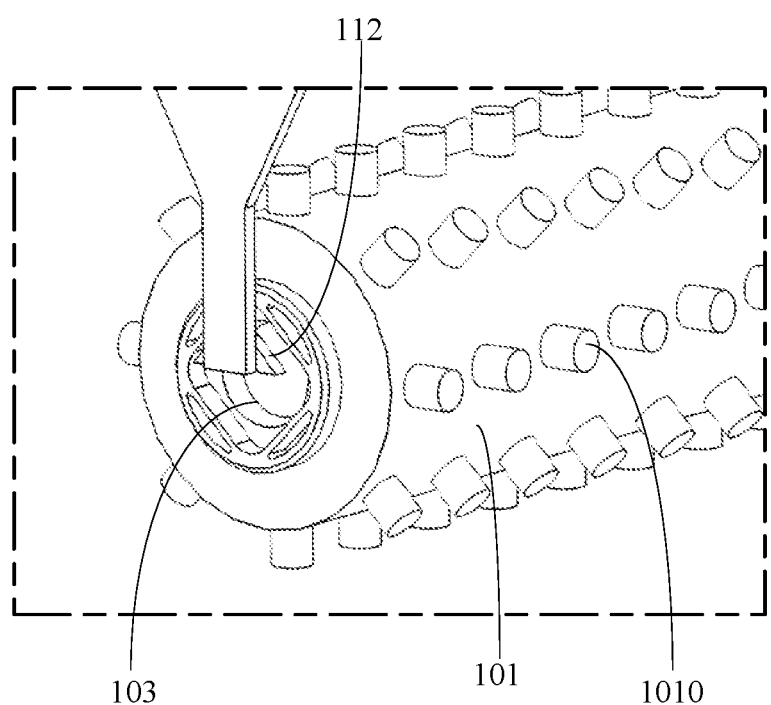
FIG. 2 shows an assembling schematic diagram of a first hook of a replacing tool and a concave end of a sponge brush according to one embodiment of the disclosure.
Figure 9:
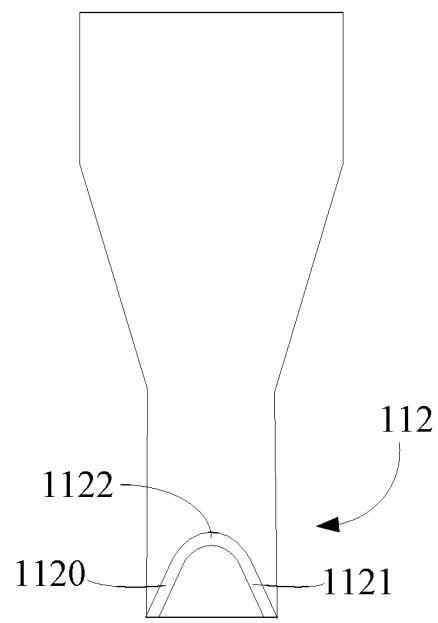
FIG. 9 shows a schematic plan diagram of a first hook of a replacing tool from a viewing angle according to one embodiment of the disclosure.

In one embodiment of the disclosure, as shown in FIG. 2 and FIG. 9, the first hook 112 may include a first planar part 1120 and a second planar part 1121 disposed at an angle relative to each other, and an arc part 1122 for connecting the first planar part 1120 and the second planar part 1121 with each other. An outer surface of each of the first planar part 1120, the second planar part 1121 and the arc part 1122 can be in contact with an inner wall surface of the concave end of the sponge brush 10. With the foregoing design of the first hook 112, the space degree of freedom of the sponge brush 10 as a whole may be limited, and the situation that the first hook 112 and the concave end of the sponge brush 10 can rotate relative to each other is avoided, thereby ensuring that the replacing tool 11 can clamp the sponge brush 10 stably, and avoiding the sponge brush 10 from falling off.

For example, the angle between the first planar part 1120 and the second planar part 1121 may be an acute angle or a right angle, which is not limited herein.

It should be noted that the first hook 112 may also be designed in other forms, as long as it is ensured that the first hook 112 can be engaged into and detached from the concave end of the sponge brush 10 smoothly, and that the first hook 112 can limit the space degree of freedom of the sponge brush 10 as a whole.

For example, the first hook 112 may be detachably connected to the first beam 110 through a screw or a bolt, so that when the first hook 112 is damaged, only the first hook 112 needs to be replaced, the whole replacing tool 11 does not need to be repaired or replaced, thereby reducing the maintenance cost. However, it is not limited herein. The first hook 112 may also be integrally formed with the first beam 110, so as to simplify the assembling difficulty of the replacing tool 11.

Figure 3:
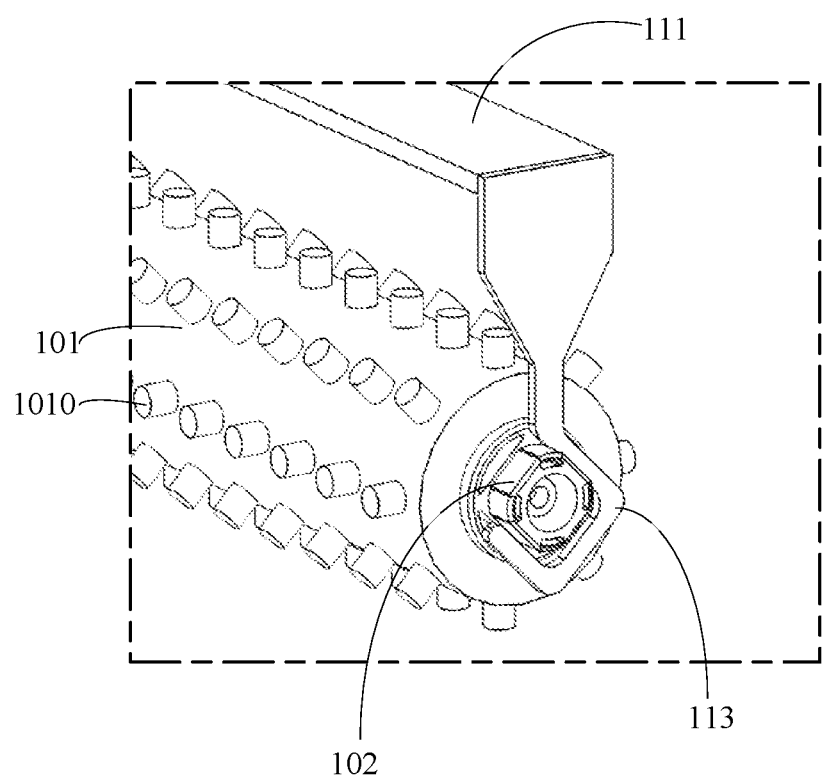
FIG. 3 shows an assembling schematic diagram of a second hook of a replacing tool and a convex end of a sponge brush according to one embodiment of the disclosure.
Figure 10:
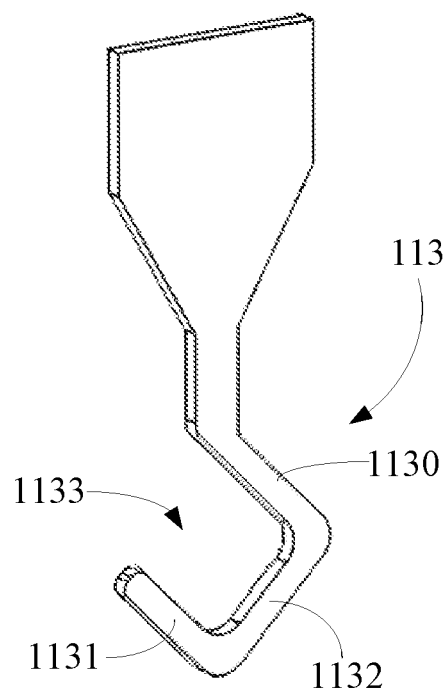
FIG. 10 shows a perspective schematic diagram of a second hook of a replacing tool from a viewing angle according to one embodiment of the disclosure.

In one embodiment of the disclosure, as shown in FIG. 3, FIG. 7 and FIG. 10, the second hook 113 includes a third planar part 1130 and a fourth planar part 1131 parallel to each other, and a fifth planar part 1132 for connecting the third planar part 1130 and the fourth planar part 1131 with each other. The fifth planar part 1132 is connected with the third planar part 1130 and the fourth planar part 1131 by an arc transition. An inner surface of each of the third planar part 1130, the fourth planar part 1131 and the fifth planar part 1132 is in contact with an outer wall surface of the convex end 102 of the sponge brush 10. With the foregoing design of the second hook 113, the space degree of freedom of the sponge brush 10 as a whole may be limited, and the situation that the second hook 113 and the convex end 102 of the sponge brush 10 can rotate relative to each other is avoided, thereby ensuring that the replacing tool 11 can clamp the sponge brush 10 stably, and avoiding the sponge brush 10 from falling off.

It should be understood that, as shown in FIG. 10, an installing notch 1133 is provided in a position in the second hook 113 opposite to the third planar part 1130. The second hook 113 may be arranged around the convex end 102 of the sponge brush 10 or detached from the convex end 102 of the sponge brush 10 through the installing notch 1133.

It should be noted that the second hook 113 may also be designed in other forms, as long as it is ensured that the second hook 113 can be arranged around and detached from the convex end 102 of the sponge brush 10 smoothly, and that the second hook 113 can limit the space degree of freedom of the sponge brush 10 as a whole.

For example, the second hook 113 may be detachably connected to the second beam 111 through a screw or a bolt, so that when the second hook 113 is damaged, only the second hook 113 needs to be replaced, the whole replacing tool 11 does not need to be repaired or replaced, thereby reducing the maintenance cost. However, it is not limited herein. The second hook 113 may also be integrally formed with the second beam 111 to simplify the assembling difficulty of the replacing tool 11.

In one embodiment of the disclosure, the replacing tool 11 is an anti-corrosion structure as a whole, so that the replacing tool 11 is prevented from being corroded by spraying liquid for cleaning a wafer in the semiconductor chemical mechanical polishing apparatus during a replacement process of the sponge brush 10 of the semiconductor chemical mechanical polishing apparatus, thereby prolonging the service life of the replacing tool 11.

For example, the overall material of the replacing tool 11 may include, but is not limited to, acid and alkali resistant materials such as polytetrafluoroethylene (PTFE) and stainless steel.

It should be understood that the replacing tool 11 described in any one of the foregoing embodiments is applicable not only to the replacement of the sponge brush 10 in the semiconductor chemical mechanical polishing apparatus, but also to the replacement of other structures, which has a wide range of application.

Figure 11:
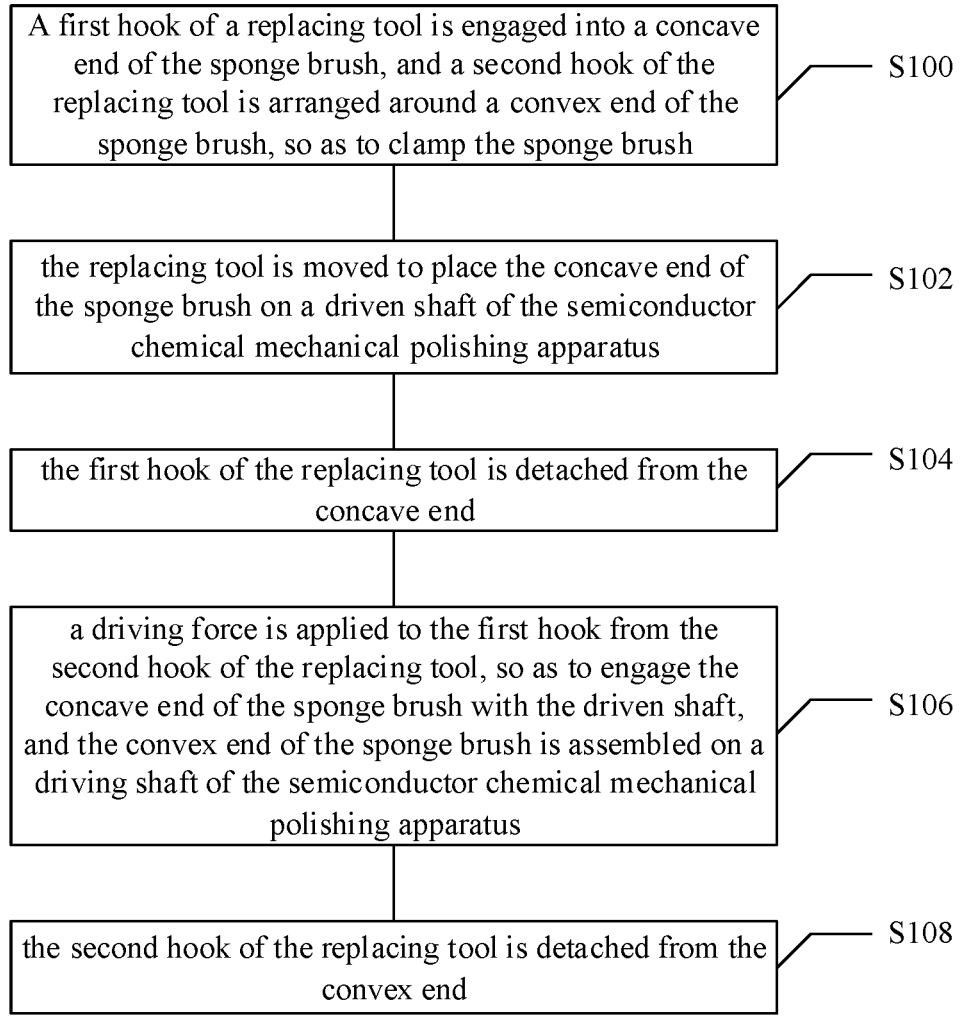
FIG. 11 shows a flow chart of a method for installing a sponge brush of a semiconductor chemical mechanical polishing apparatus according to one embodiment of the disclosure.

The disclosure further provides a method for installing a sponge brush 10 of a semiconductor chemical mechanical polishing apparatus. The method uses the replacing tool 11 shown in any one of the embodiments in the FIG. 1 to FIG. 10. Specifically, as shown in FIG. 11, the method may include the following operations.

In S100, a first hook 112 of a replacing tool 11 is engaged into a concave end 103 of the sponge brush 10, and a second hook 113 of the replacing tool 11 is arranged around a convex end 102 of the sponge brush 10, so as to clamp the sponge brush 10.

In S102, the replacing tool 11 is moved to place the concave end 103 of the sponge brush 10 on a driven shaft of the semiconductor chemical mechanical polishing apparatus.

In S104, the first hook 112 of the replacing tool 11 is detached from the concave end 103.

In S106, a driving force is applied to the first hook 112 from the second hook 113 of the replacing tool 11, so as to engage the concave end 103 of the sponge brush 10 with the driven shaft, and the convex end 102 of the sponge brush 10 is assembled on a driving shaft of the semiconductor chemical mechanical polishing apparatus.

In S108, the second hook 113 of the replacing tool 11 is detached from the convex end 102.

In the embodiment of the disclosure, compared with the solution of replacing the sponge brush 10 manually by the operator, the solution of replacing the sponge brush 10 by using the replacing tool 11 may greatly reduce the possibility of the contamination of the sponge brush 10 during a replacement process, so that it is possible to avoid the situation that particles remain on the surface of the wafer due to the contamination of the sponge brush 10, thereby improving the quality of the product, reducing the abnormal consumption of wafer consumables, and saving the labor costs.

It should be noted that in S100, the first hook 112 of the replacing tool 11 may be engaged into the concave end 103 of the sponge brush 10 firstly, and then the second hook 113 of the replacing tool 11 is arranged around the convex end 102 of the sponge brush 10. However, it is not limited herein. The second hook 113 of the replacing tool 11 may be arranged around the convex end 102 of the sponge brush 10 firstly, and then the first hook 112 is engaged into the concave end 103 of the sponge brush 10. Alternatively, while the first hook 112 is engaged into the concave end 103 of the sponge brush 10, the second hook 113 of the replacing tool 11 is arranged around the convex end 102 of the sponge brush 10.

In one embodiment of the disclosure, in a case that the connection mechanism in the replacing tool 11 is a hinge mechanism 114, S104 may include the following operation that: a first beam 110 is rotated in a direction away from the sponge brush 10, so as to tilt the first hook 112 and to detach the first hook from the concave end 103 of the sponge brush 10.

In another embodiment of the disclosure, in a case that the connection mechanism in the replacing tool 11 is a sliding mechanism 115, S104 may include the following operation that: the first beam 110 slides in a direction toward the driven shaft, so as to slide the first hook 112 in a direction away from the second hook 113 and to detach the first hook from the concave end 103 of the sponge brush 10.

The disclosure further provides a semiconductor chemical mechanical polishing apparatus, including a driving shaft (not shown in figures), a driven shaft (not shown in figures), a sponge brush 10 described in any one of the embodiments in FIG. 1 to FIG. 10, and a replacing tool 11 described in any one of the above embodiments. The sponge brush 10 includes a concave end 103 and a convex end 102. A specific structure of the sponge brush 10 may refer to the structure described in the foregoing embodiments and will not be described in detail herein. The concave end 103 of the sponge brush 10 is engaged with the driven shaft and the convex end 102 of the sponge brush 10 is engaged with the driving shaft through the replacing tool 11. A specific installing method of the sponge brush 10 may refer to the method for installing a sponge brush 10 of the semiconductor chemical mechanical polishing apparatus mentioned in the foregoing embodiments, and will not be described in detail herein.

Figure 12:
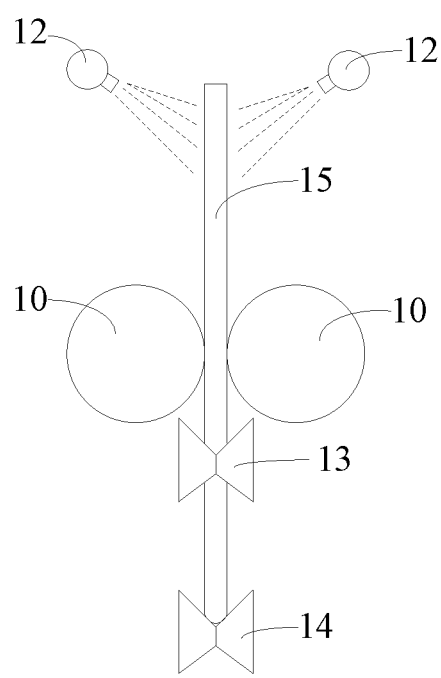
FIG. 12 shows a schematic diagram of a position relationship of a part of structures in a semiconductor chemical mechanical polishing apparatus according to one embodiment of the disclosure.

In addition, as shown in FIG. 12, the semiconductor chemical mechanical polishing apparatus may further include a spraying mechanism 12 which is configured to spray cleaning liquid on a surface of the wafer to further clean the surface of the wafer, so that the particle impurities on the surface of the wafer are removed.

It should be noted that a plurality of sponge brushes 10 and spraying mechanisms 12 may be provided and respectively arranged at either side of the wafer, so as to simultaneously clean both surfaces of the wafer, thereby improving the cleaning efficiency.

As shown in FIG. 12, the semiconductor chemical mechanical polishing apparatus further includes a driving wheel 13 and an idler wheel 14 which are configured to drive the wafer into rotation. The idler wheel 14 is configured to ensure the rotating stability of the wafer. A plurality of driving wheels 13 and idler wheels 14 may be provided.

The technical solution provided by the disclosure may achieve the following beneficial effects.

The sponge brush of the semiconductor chemical mechanical polishing apparatus is replaced by using the replacing tool provided by the disclosure, so that it may avoid the situation that the sponge brush is contaminated due to touch of the operator when the sponge brush is replaced. That is, compared with a solution that an operator replaces the sponge brush manually, this solution may greatly reduce the possibility that the sponge brush is contaminated during a replacement process, thereby avoiding particles from remaining on a surface of a wafer due to the contamination of the sponge brush, and improving the quality of the product. In addition, the replacing tool is easy to operate, and the operator may replace the sponge brush by using the replacing tool through simple training.

Other embodiments of the disclosure will be apparent to those skilled in the art from consideration of the specification and practice of the disclosure disclosed here. The disclosure is intended to cover any variations, uses, or adaptations of the disclosure, following the general principles thereof, and including such departures from the disclosure as come within known or customary practice in the art. It is intended that the specification and embodiments are considered as exemplary only, with a true scope and spirit of the disclosure being indicated by the appended claims.

What is claimed is:

1. A replacing tool for a sponge brush of a semiconductor chemical mechanical polishing apparatus, comprising a first beam, a connection mechanism, a second beam, a first hook, and a second hook, wherein the first beam is connected to the second beam through the connection mechanism, the first hook is fixedly connected to the first beam, an L-shape portion of the first hook is configured to be engaged into a concave end of the sponge brush, the second hook is fixedly connected to the second beam, and a U-shape portion of the second hook is configured to be arranged around a convex end of the sponge brush,
    wherein the first beam and the second beam are movable relative to each other, so that the first hook is engaged with or detached from the concave end of the sponge brush, and the second hook is engaged with or detached from the convex end of the sponge brush;
    wherein the connection mechanism is a hinge mechanism, and
    wherein the hinge mechanism comprises a first connection sheet, a rotating shaft, and a second connection sheet, the first connection sheet is rotatably connected to the second connection sheet through the rotating shaft, the first connection sheet is connected to the first beam, and the second connection sheet is connected to the second beam.

2. The replacing tool of claim 1, wherein the first hook comprises a first planar part and a second planar part disposed at an angle relative to each other, and an arc part for connecting the first planar part and the second planar part with each other, and
    wherein an outer surface of each of the first planar part, the second planar part and the arc part is configured to be in contact with an inner wall surface of the concave end of the sponge brush.

3. The replacing tool of claim 2, wherein the replacing tool is an anti-corrosion structure.

4. The replacing tool of claim 1, wherein the second hook comprises a third planar part and a fourth planar part parallel to each other, and a fifth planar part for connecting the third planar part and the fourth planar part with each other, the fifth planar part being connected with the third planar part and the fourth planar part by an arc transition, and
    wherein an inner surface of each of the third planar part, the fourth planar part and the fifth planar part is in contact with an outer wall surface of the convex end of the sponge brush.

5. The replacing tool of claim 4, wherein the replacing tool is an anti-corrosion structure.

6. The replacing tool of claim 1, wherein the replacing tool is an anti-corrosion structure.

7. The replacing tool of claim 1, wherein the replacing tool is an anti-corrosion structure.

8. A method for installing a sponge brush of a semiconductor chemical mechanical polishing apparatus, wherein the method is implemented by a replacing tool, the replacing tool comprises a first beam, a connection mechanism, a second beam, a first hook, and a second hook, the first beam is connected to the second beam through the connection mechanism, the first hook is fixedly connected to the first beam, a portion of the first hook is configured to be engaged into a concave end of the sponge brush, the second hook is fixedly connected to the second beam, and a portion of the second hook is arranged around a convex end of the sponge brush, the first beam and the second beam are movable relative to each other, so that the first hook is engaged with or detached from the concave end of the sponge brush, and the second hook is engaged with or detached from the convex end of the sponge brush,
    the method comprising:
    engaging the first hook of the replacing tool into the concave end of the sponge brush, and arranging the second hook of the replacing tool around the convex end of the sponge brush to clamp the sponge brush;
    moving the replacing tool to place the concave end of the sponge brush on a driven shaft of the semiconductor chemical mechanical polishing apparatus;
    detaching the first hook of the replacing tool from the concave end;
    applying a driving force to the first hook from the second hook of the replacing tool to engage the concave end of the sponge brush with the driven shaft, and assembling the convex end of the sponge brush on a driving shaft of the semiconductor chemical mechanical polishing apparatus; and
    detaching the second hook of the replacing tool from the convex end.

9. The method for installing a sponge brush of a semiconductor chemical mechanical polishing apparatus of claim 8, wherein
    the connection mechanism of the replacing tool is a hinge mechanism, and the hinge mechanism comprises a first connection sheet, a rotating shaft, and a second connection sheet, the first connection sheet is rotatably connected to the second connection sheet through the rotating shaft, the first connection sheet is connected to the first beam, and the second connection sheet is connected to the second beam, wherein detaching the first hook of the replacing tool from the concave end comprises: rotating the first beam in a direction away from the sponge brush to tilt the first hook and to detach the first hook from the concave end of the sponge brush.

10. A semiconductor chemical mechanical polishing apparatus, comprising: a driving shaft, a driven shaft, a sponge brush, and a replacing tool, wherein the replacing tool comprises a first beam, a connection mechanism, a second beam, a first hook, and a second hook, the first beam is connected to the second beam through the connection mechanism, the sponge brush is provided with a concave end and a convex end, the first hook is fixedly connected to the first beam, a portion of the first hook is configured to be engaged into a concave end of the sponge brush, the second hook is fixedly connected to the second beam, and a portion of the second hook is arranged around a convex end of the sponge brush, the first beam and the second beam are movable relative to each other, so that the first hook is engaged with or detached from the concave end of the sponge brush, and the second hook is engaged with or detached from the convex end of the sponge brush, the concave end of the sponge brush is engaged with the driven shaft and the convex end of the sponge brush is engaged with the driving shaft through the replacing tool.

\* \* \* \* \*